United States Patent
Slotboom et al.

(10) Patent No.: US 6,984,558 B2
(45) Date of Patent: Jan. 10, 2006

(54) METHOD OF MANUFACTURING A SEMICONDUCTOR DEVICE WITH NON-VOLATILE MEMORY COMPRISING A MEMORY CELL WITH AN ACCESS GATE AND WITH A CONTROL GATE AND A CHARGE STORAGE REGION

(75) Inventors: Michiel Slotboom, Leuven (BE); Franciscus Petrus Widdershoven, Leuven (BE)

(73) Assignee: Koninklijke Philips Electronics N.V., Eindhoven (NL)

(*) Notice: Subject to any disclaimer, the term of this patent is extended or adjusted under 35 U.S.C. 154(b) by 183 days.

(21) Appl. No.: 10/485,496

(22) PCT Filed: Jun. 4, 2002

(86) PCT No.: PCT/IB02/02040

§ 371 (c)(1),
(2), (4) Date: Jan. 30, 2004

(87) PCT Pub. No.: WO03/015152

PCT Pub. Date: Feb. 20, 2003

(65) Prior Publication Data

US 2004/0175886 A1    Sep. 9, 2004

(30) Foreign Application Priority Data

Aug. 6, 2001 (EP) ................................. 01203000
Aug. 6, 2001 (EP) ................................. 01203001
May 2, 2002 (EP) ................................. 02076743

(51) Int. Cl.
*H01L 21/336* (2006.01)
(52) U.S. Cl. ...................................... 438/257; 438/267
(58) Field of Classification Search ............... 438/257, 438/267
See application file for complete search history.

(56) References Cited

U.S. PATENT DOCUMENTS 6,335,554 B1 * 1/2002 Yoshikawa ................ 257/316
6,476,440 B1 * 11/2002 Shin .......................... 257/320
6,632,714 B2 * 10/2003 Yoshikawa ................ 438/258

OTHER PUBLICATIONS

International Search Report WO 2003/01512 A3.*

* cited by examiner

*Primary Examiner*—David S. Blum
(74) *Attorney, Agent, or Firm*—Peter Zawilski

(57) ABSTRACT

Method of manufacturing a semiconductor device comprising a semiconductor body (1) which is provided at a surface (2) with a non-volatile memory comprising a memory cell with a gate structure (4) with an access gate (19) and a gate structure (3) with a control gate (5) and a charge storage region situated between the control gate (5) and the semiconductor body (1), such as a floating gate (6). In this method on the surface (2) of the semiconductor body (1) a first one of said gate structures is formed with side walls (10) extending substantially perpendicular to the surface, a conductive layer is deposited (13) on and next to said first gate-structure, the conductive layer is subjected to a planarizing treatment until the first gate structure is exposed and the so planarized conductive layer is patterned so as to form at least a part of the other gate structure adjoining the first gate structure. Said patterning of the planarized conductive layer is performed in that the planarized conductive layer (14) is etched back so as to expose an upper portion (15) of the side walls of the first gate structure, a spacer (18) is formed on the exposed upper portion (15) of the side walls of first gate structure and the conductive layer (16) is etched anisotropically using the spacer as a mask. Thus very small memory cells can be realized.

11 Claims, 13 Drawing Sheets

Figure 1:
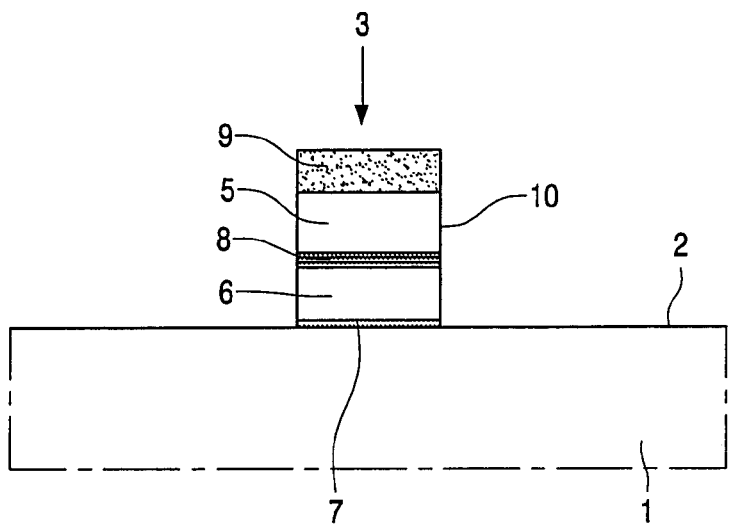

METHOD OF MANUFACTURING A SEMICONDUCTOR DEVICE WITH NON-VOLATILE MEMORY COMPRISING A MEMORY CELL WITH AN ACCESS GATE AND WITH A CONTROL GATE AND A CHARGE STORAGE REGION

The invention relates to a method of manufacturing a semiconductor device comprising a semiconductor body which is provided at a surface with a non-volatile memory comprising a memory cell with a gate structure with an access gate and a gate structure with a control gate and a charge storage region situated between the control gate and the semiconductor body, in which method on the surface of the semiconductor body a first one of said gate structures is formed with side walls extending substantially perpendicular to the surface, a conductive layer is deposited on and next to said first gate-structure, the conductive layer is subjected to a planarizing treatment until the first gate structure is exposed and the so planarized conductive layer is patterned so as to form at least a part of the other gate structure adjoining the first gate structure.

In practice the charge storage region can be a floating gate or a gate dielectric comprising a distribution of mutually separated trapping centers. Such a gate dielectric may, for example, be a silicon oxide layer with contaminations, for example metal particles, distributed therein, the contaminations thereby providing the trapping centers. However, a more widespread way is the use of a gate dielectric comprising a double layer of two different materials, which form a border layer supplying the mutually separated trapping centers. Using the above mentioned method both gate structures adjoin each other, so that small sized memory cells can be made. In practice a non-volatile memory of course will comprise a very large number of these memory cells.

From WO 01/67517 A1 a method as mentioned before is known, in which method the planarized conductive layer is patterned by anisotropic etching, after a photo resist mask has been formed on the first gate structure and next to the first gate structure on the planarized conductive layer.

The use of the photo resist mask in the known method will lead to extra costs, but what is more important that it will influence the size of the memory cell. The photo resist mask can not be placed exactly in a desired position, but overlay errors, if any, should be considered. This will lead to a relatively large photo resist mask and thus to a relatively large memory cell.

The invention has for its object to provide a method, which offers the possibility of manufacturing very small memory cells with relatively small costs.

According to the invention the method mentioned in the opening paragraph is therefore characterized in that to perform the patterning of the planarized conductive layer, the planarized conductive layer is etched back so as to expose an upper portion of the side walls of the first gate structure, a spacer is formed on the exposed upper portion of the side walls of first gate structure and the conductive layer is etched anisotropically using the spacer as a mask.

The spacer on the exposed upper portions of the side walls of the first one of the gate structures can be made at minimum costs, without using a photo resist mask, in a self aligned manner. Such spacers on vertical walls are formed in practice by depositing an auxiliary layer and then etching said auxiliary layer anisotropically until only spacers are left on the vertical walls. The width of the spacers then equals about the thickness of the auxiliary layer. Because the spacer thus can be made with a very small width and because overlay errors have not to be considered, very small memory cells can be realized.

A first preferred embodiment of the method according to the invention is characterized in that as the first one of said gate structures the gate structure with the control gate and the charge storage region situated between the control gate and the semiconductor body is formed, after which the side walls of this gate structure are covered by an insulating layer and the surface of the semiconductor body next to the gate structure with a gate dielectric, the conductive layer is deposited, planarized, etched back and patterned using the spacer formed on the exposed portions of the gate structure as a mask so as to form the gate structure with the access gate. As said before the charge storage region can be a floating gate or a gate dielectric comprising a distribution of mutually separated trapping centers. This gate structure with control gate and charge storage region can be etched anisotropically in a stack of layers formed on the surface of the semiconductor body. Then automatically said side walls perpendicular to the surface of the semiconductor are formed. These side walls can be covered easily by an insulating layer by depositing a layer followed by an anisotropic etch until the top of the gate structure is exposed or also by an oxidation treatment, when, what is usual in practice, the gates in the gate structure are formed in layers of polycrystalline silicon. On top of the stack of said layers an extra layer may be deposited which may act as a protection layer during forming the insulating layer on the side walls and also as a stop layer during the planarizing treatment.

A second preferred embodiment of the method according to the invention is characterized in that as the first one of said gate structures the gate structure with the access gate is formed, after which the side walls of this gate structure are covered by an insulating layer, the conductive layer is deposited, planarized, etched back and patterned using the spacer formed on the exposed portions of the gate structure as a mask so as to form the control gate of the gate structure with the control gate and the charge storage region situated between the control gate and the semiconductor body. This embodiment of the method offers, as will be demonstrated later with reference to the drawing, the opportunity of realizing a lot of gate structures with control gate and charge storage region, without using photo resist masks.

These and other aspects of the invention will be apparent from and be elucidated with reference to the embodiments described hereinafter and shown in the drawing. In the drawing:

FIGS. 1 to 9 show a diagrammatic cross-sectional views of successive stages in the manufacture of a non volatile memory cell using a first embodiment of the method according to the invention, FIGS. 10 to 15 show a diagrammatic cross-sectional views of successive stages in the manufacture of a non volatile memory cell using a second embodiment of the method according to the invention, FIGS. 16 to 21 show a diagrammatic cross-sectional views of successive stages in the manufacture of a non volatile memory cell using a third embodiment of the method according to the invention, FIGS. 22 to 30 show a diagrammatic cross-sectional views of successive stages in the manufacture of a non volatile memory cell using a forth embodiment of the method according to the invention and FIGS. 31 to 36 show a diagrammatic cross-sectional views of successive stages in the manufacture of a non volatile memory cell using a fifth embodiment of the method according to the invention.

FIGS. 1 to 9 show in diagrammatic cross-sectional views successive stages of manufacturing a semiconductor device with a non-volatile memory comprising a memory cell with a gate structure 4 with an access gate 19 and a gate structure 3 with a control gate 5 and a charge storage region 6 situated between the control gate 5 and a semiconductor body 1. For the sake of clarity the manufacture of only one of such cells is described, but it will be clear, that in practice a non volatile memory comprises a lot of these memory cells.

As shown in FIG. 1 on a surface 2 of the semiconductor body 1, here a p-type doped silicon body, a first one of the gate structures, in this example the gate structure 3 with the control gate 5 and the charge storage region situated between the control gate and the semiconductor body are formed. In this example the charge storage region is a floating gate 6. The gate structure 3 here comprises a tunnel dielectric 7, a floating gate 6, an inter gate dielectric 8 and a top layer 9. The gate structure is formed by an anisotropic etch of a stack of layers. The tunnel dielectric 7 may be formed in a 7 nm thick layer of silicon oxide, the floating gate 6 in an about 200 nm thick layer of polycrystalline silicon, the inter gate dielectric 8 in an about 18 nm thick layer of ONO (a 6 nm thick layer of silicon oxide, a 6 nm thick layer of silicon nitride and a 6 nm thick layer of silicon oxide), the control gate 5 in an about 200 nm thick layer of polycrystalline silicon and the top layer 9 in an about 100 nm thick layer of silicon nitride. Because the gate structure 3 is formed by an anisotropic etch the structure has side walls 10 extending substantially perpendicular to the surface 2 of the semiconductor body 1.

Figure 2:
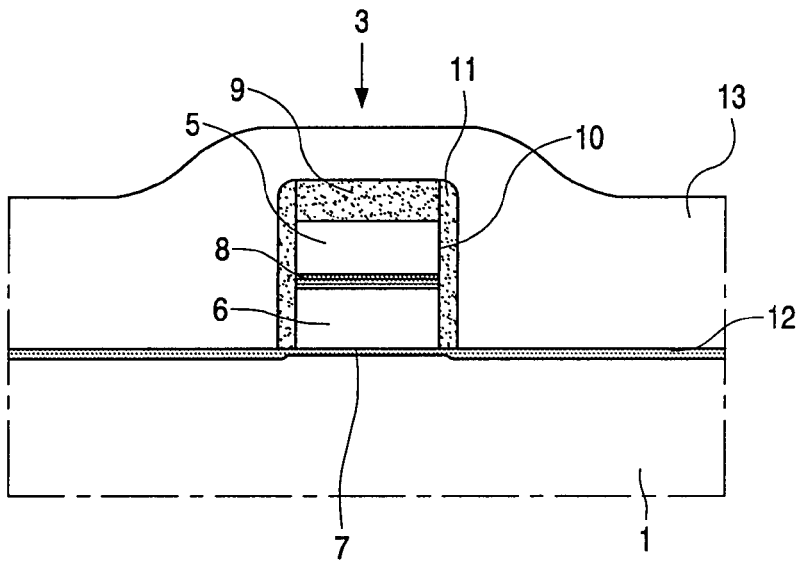

As shown in FIG. 2 the side walls 10 are covered by an about 30 nm thick insulating layer 11, here a layer of silicon oxide and the surface next to the gate structure 3 is covered with a gate dielectric 12, here an about 10 nm thick layer of silicon oxide. The insulating layer 11 may be formed by thermal oxidation of the gate structure or by depositing a layer followed by an anisotropic etch which is stopped as soon as the top layer 9 is exposed.

Figure 3:
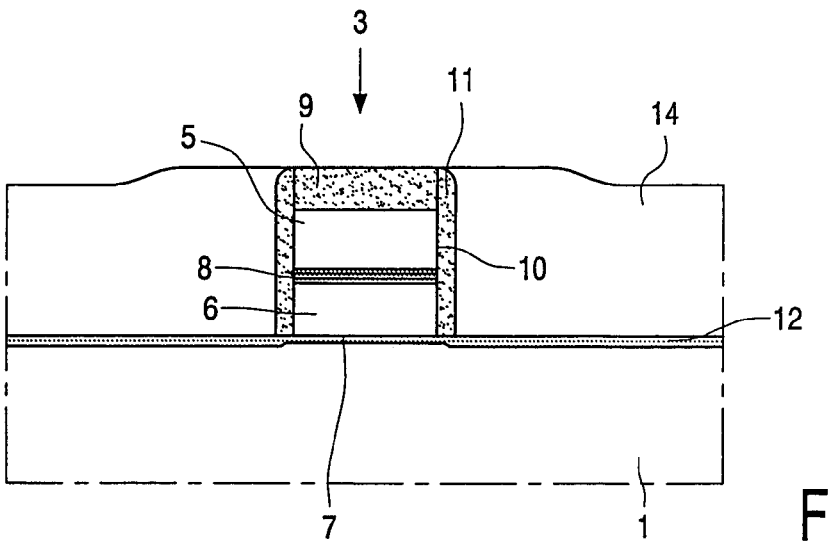

After the gate structure 3 is formed and its side walls are covered with the insulating layer 11, a relatively thick conductive layer 13, here an about 500 nm thick layer of polycrystalline silicon is deposited on and next to said first gate-structure 3. As shown in FIG. 3 the conductive layer 13 then is subjected to a planarizing treatment until the top layer 9 of the first gate structure 3 is exposed. The so planarized conductive layer 14 then is patterned so as to form at least a part of the other gate structure adjoining the first gate structure 3.

Figure 4:
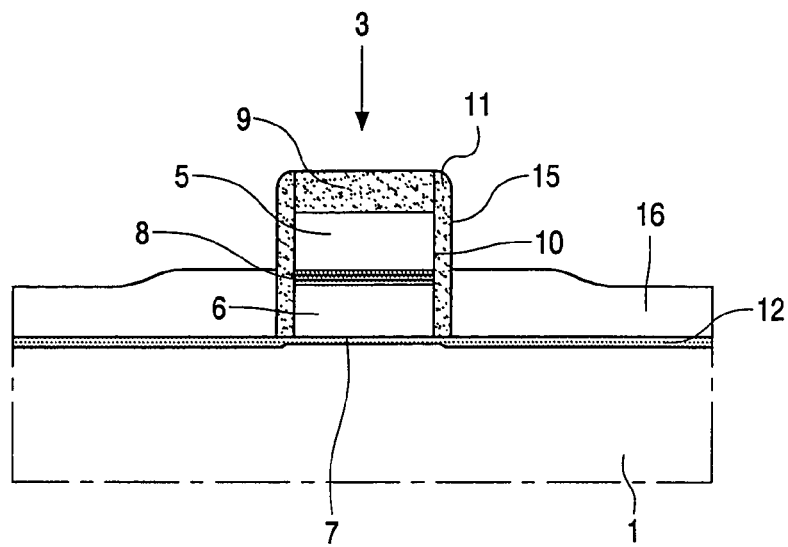
Figure 5:
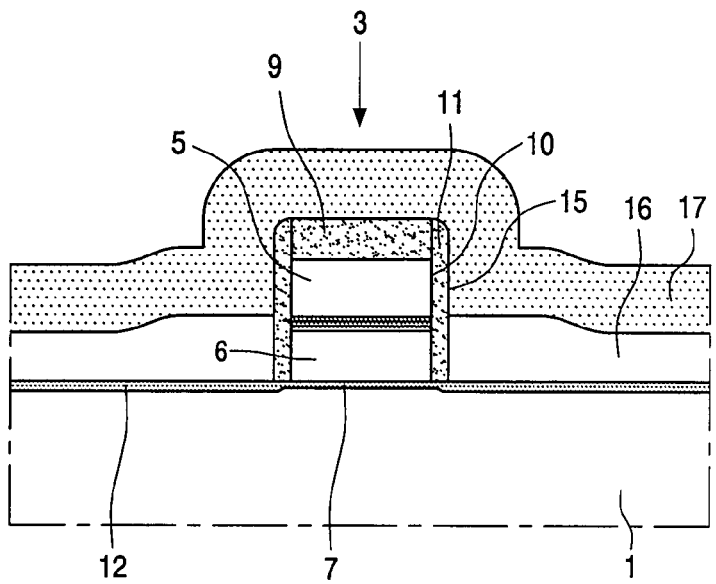
Figure 6:
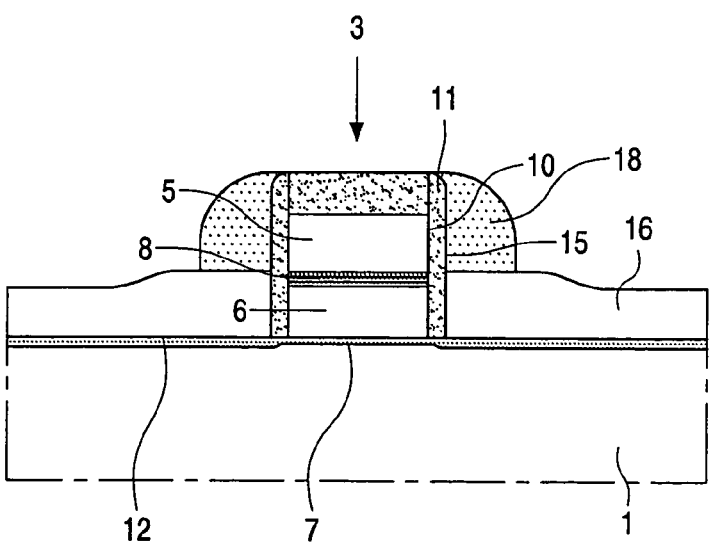

The patterning of the planarized conductive layer 14 is performed as shown in the FIGS. 4, 5 and 6. In a first step, as shown in FIG. 4 the planarized conductive layer 14 is etched back so as to expose an upper portion 15 of the side walls 10 of the first gate structure 3. This etching back can be carried out by means of an isotropic etch or anisotropic etch or as a combination of an isotropic etch and an anisotropic etch. From the conductive layer 14 then remains a part 16. Then a spacer 18 is formed on the exposed upper portion 15 of the side walls 10 of first gate structure 3. The spacers 18 are formed in a usual manner by depositing a layer 17 here a layer of silicon oxide, followed by an anisotropic etch until the top layer 9 of the first gate structure 3 is exposed. As shown in FIG. 6, then the remaining part of the conductive layer 16 is etched anisotropically using the spacer as a mask. Thus the second gate structure 4 is formed her consisting of a gate dielectric 12 and an access gate 19.

Figure 7:
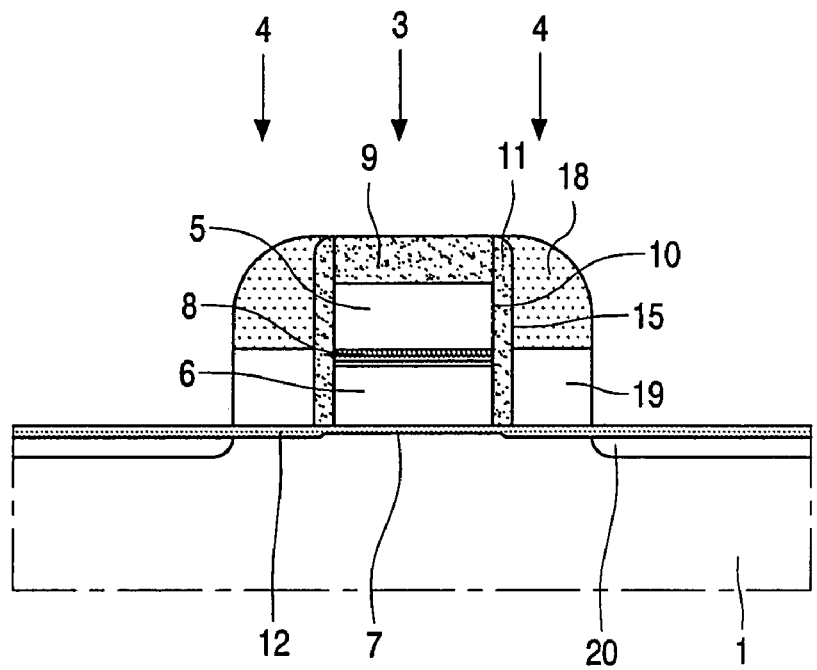
Figure 8:
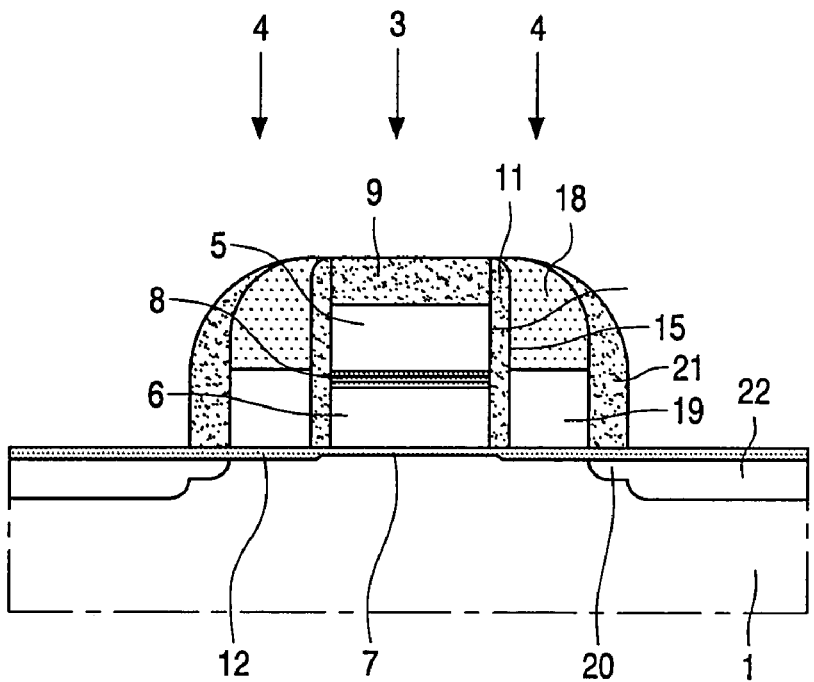
Figure 9:
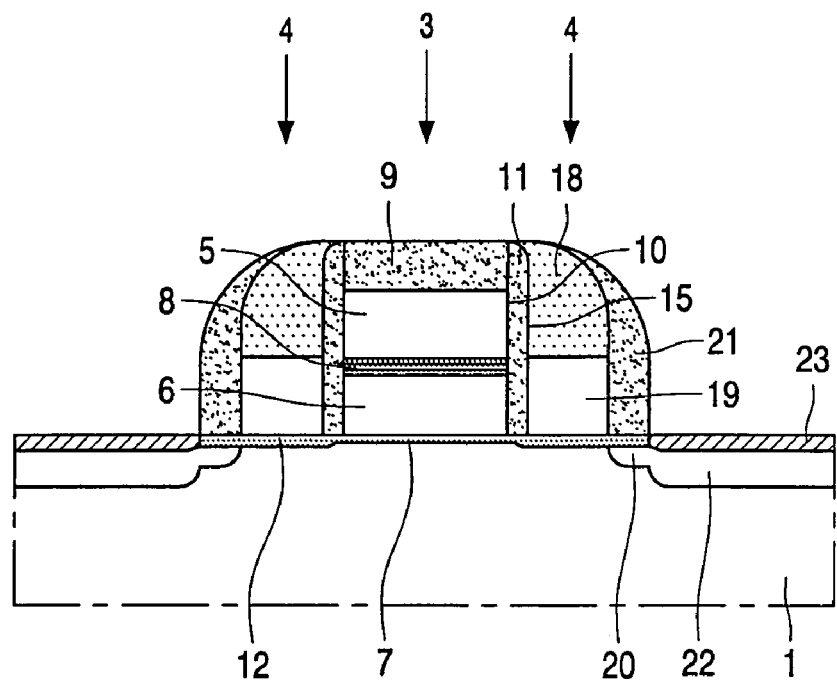

Then as shown in the FIG. 7 in a usual manner lightly doped source- and drain zones 20 are formed by ion implantation. Then as shown in FIG. 8 further spacers 21 are formed and highly doped source- and drain zones 22 are formed. As shown in FIG. 9 the source- and drain zones the may be provided with a top layer 23 of a silicide.

The spacer 18 on the exposed upper portions 15 of the side walls 15 of the first one of the gate structures 3 can be made at minimum costs, without using a photo resist mask, in a self aligned manner. Because the spacer 18 can be made with a very small width and because overlay errors have not to be considered, very small memory cells can be realized.

In the FIGS. 1 to 9 a first embodiment of the method is shown whereby the first one of said gate structures 3 is the gate structure with the control gate 8 and the charge storage region 6 between the control gate and the semiconductor body is formed after which the side walls of this gate structure 3 are covered by an insulating layer 11, the surface of the semiconductor body next to the gate structure with a gate dielectric 12, the conductive layer 13 is deposited, planarized, etched back and patterned using the spacer 18 whereby the gate structure 4 with the access gate 19 is formed. The gate structure 3 can be formed easily in a stack of layers whereby the top layer 9 may act as a protection layer during forming the insulating layer 11 on the side walls and also as a stop layer during the planarizing treatment.

In the examples that follow, as far as possible, for corresponding parts of the memory cells the same reference numbers are used as in the manufacture of the memory cell described before.

FIGS. 10 to 15 show in diagrammatic cross-sectional views successive stages of manufacturing a semiconductor device with a non-volatile memory comprising a memory cell as in the preceding example with a gate structure 4 with an access gate 19 and a gate structure 3 with a control gate 5 and a charge storage region 6 situated between the control gate and the semiconductor body.

Figure 10:
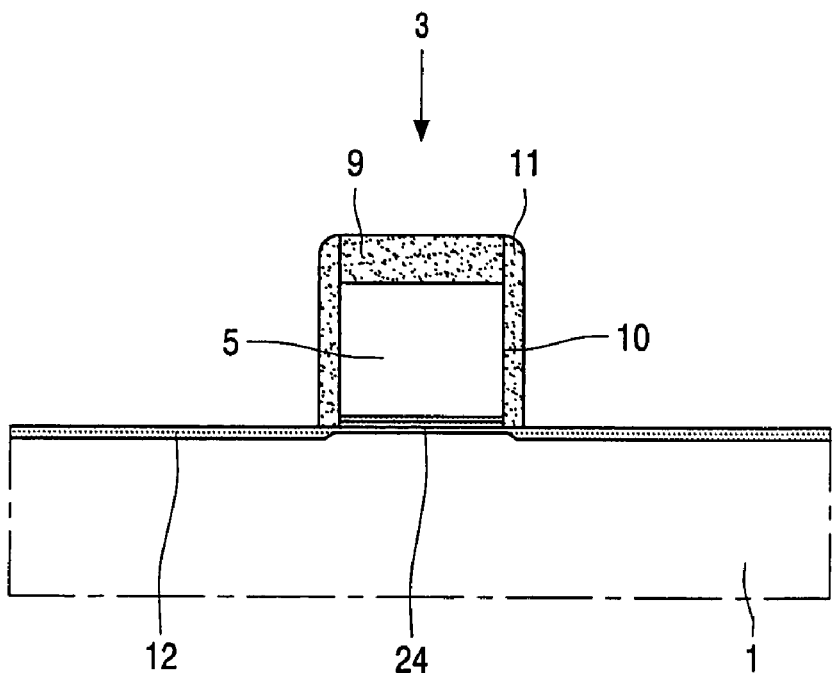

As shown in FIG. 10 the charge storage region here is formed by a stack 24 of insulating layers provided with trapping centers, here an about 6 nm thick layer of silicon oxide formed on an about 6 nm thick layer of silicon nitride formed on an about 6 nm thick layer of tunnel oxide formed on the surface 2 of the semiconductor body. On this stack the control gate 5 and the top layer 9 are formed. The side walls 10 are provided with the insulating layer 11 and the surface next to the gate-structure 3 with the layer gate oxide.

Figure 11:
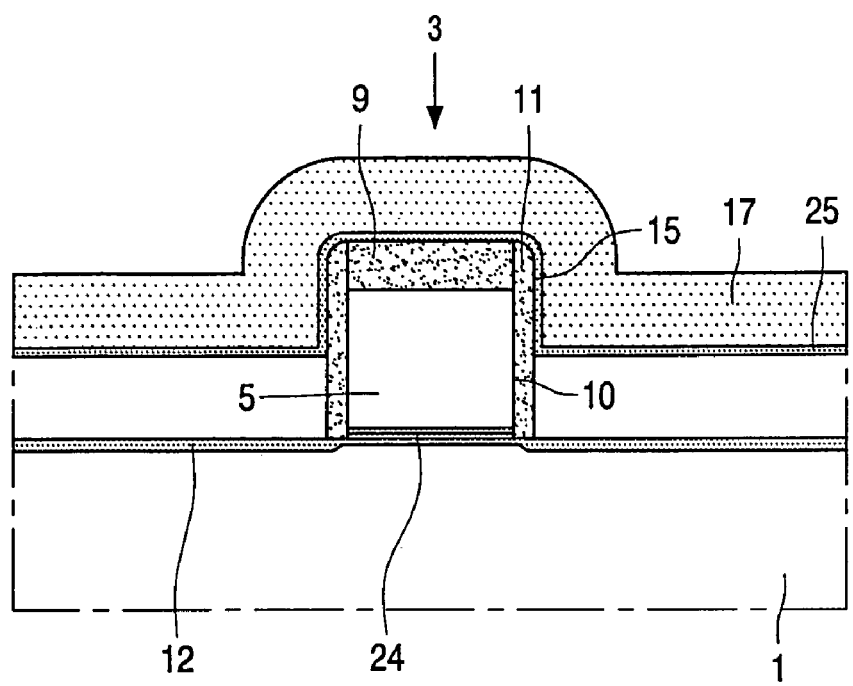
Figure 13:
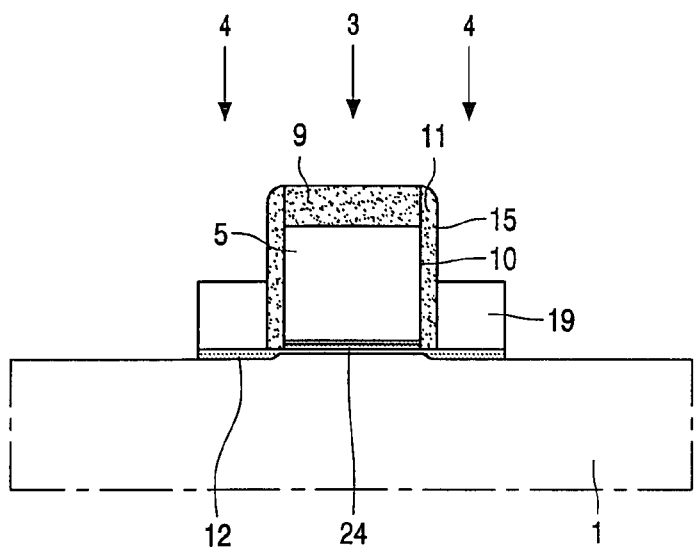

Then, as shown in FIG. 11, the conductive layer is deposited, planarized and etched back of which layer the remaining part 16 is shown. The spacer 18 here is formed in a different way as described before. First a relatively thin auxiliary insulating layer 25 is deposited, here an about 10 nm thick layer of silicon oxide, and then a further layer 17 in this example a layer of polycrystalline silicon, the same material as the conductive layer 16. Then the layer 17 is etched anisotropically until the layer 25 on top of the gate structure 3 is exposed and the layer 25 is etched anisotropically until the top layer 9 is exposed. When as shown in FIG. 13 the remaining part 16 of the conductive layer is etched the spacer 18 is also removed. When the remaining part of the insulating layer 25 is removed the structure as shown in FIG. 13 is obtained.

Figure 14:
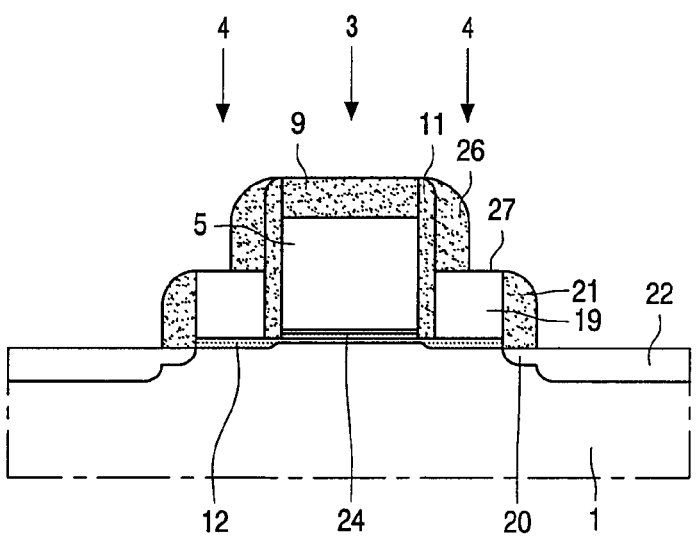

When as shown in FIG. 14 the spacer 21 is formed also a spacer 26 is formed, but a part 27 of the access gate 19 remains exposed. When the silicide regions 23 are formed on the source- and drain regions of the memory cells in the same process step silicide regions 28 are formed on the access gate 19. Said gate thus gets a relatively low electrical resistance.

FIGS. 16 to 21 show in diagrammatic cross-sectional views successive stages of manufacturing a memory cell with a gate structure 4 with an access gate 19 and a gate structure 3 with a control gate 5 and a charge storage region 6 situated between the control gate and the semiconductor body using a third embodiment of the method according to the invention. In this example as the first one of said gate structures the gate structure 4 with the access gate 19 is formed. Here the about 400 nm thick access gate 19 of polycrystalline silicon is formed on an about 10 nm thick layer of gate oxide 12 and covered by the top layer 9 of silicon nitride.

Figure 17:
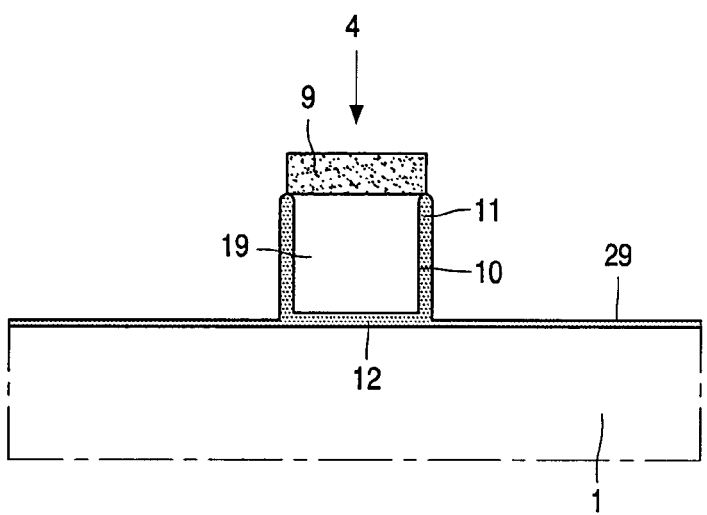
Figure 18:
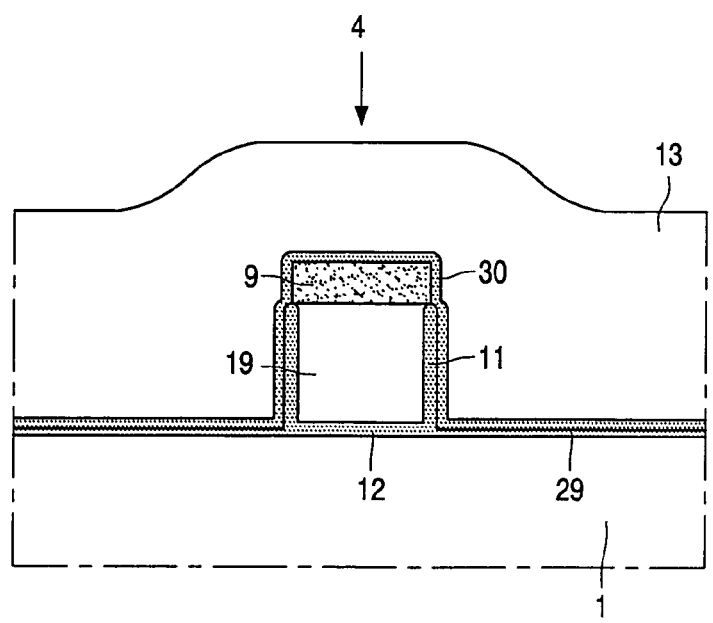
Figure 19:
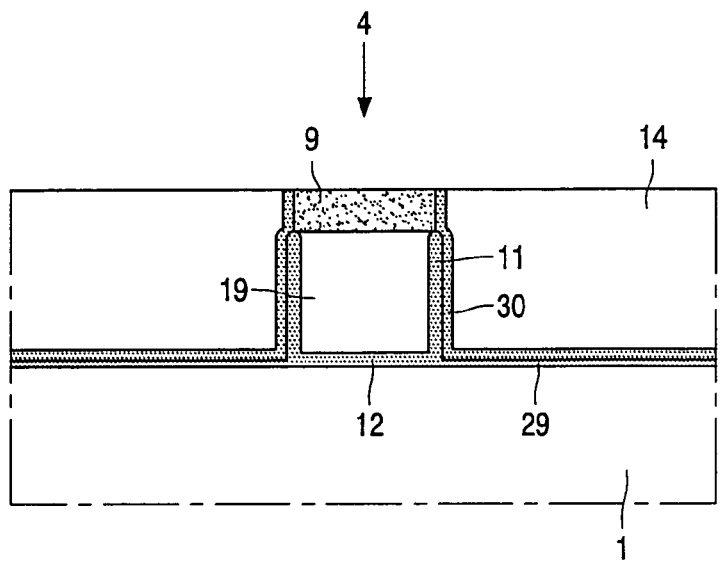

As shown in FIG. 17, the gate structure 4 is provided wit an about 30 nm thick insulating layer 11 on its side walls 10, here by thermal oxidation. At the same time, in the same process step, next to this structure 4 an about 6 nm thick silicon oxide layer 29 is formed. Some steps later, as shown in FIG. 18, the conductive layer 13 is deposited. This layer 13 is, as shown in FIG. 19, planarized whereby the top layer 9 on the gate structure 4 is exposed. The planarized layer 14, is etched back and patterned using the spacer 18 formed on the exposed portions 15 of the gate structure 4 as a mask so as to form the control gate 5 of the gate structure 4 with the control gate 5 and the charge storage region 30 situated between the control gate 5 and the semiconductor body 1.

This method gives the opportunity of realizing a lot of gate structures 4 with control gate 5 and charge storage region between that control gate and the semiconductor body, without using photo resist masks.

Figure 20:
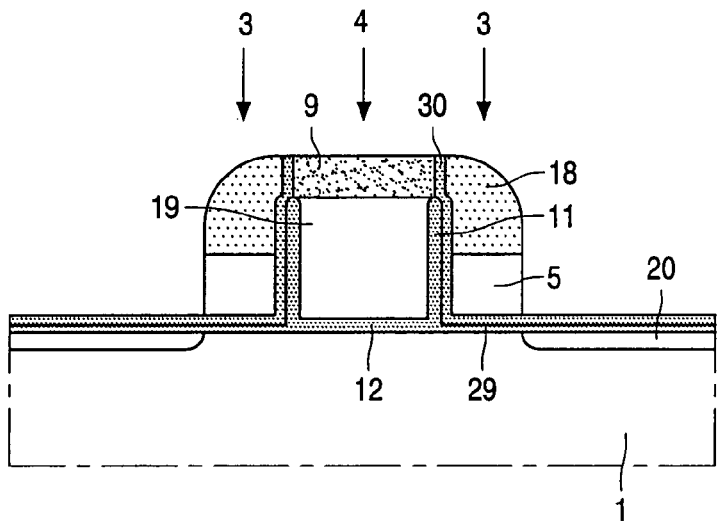
Figure 21:
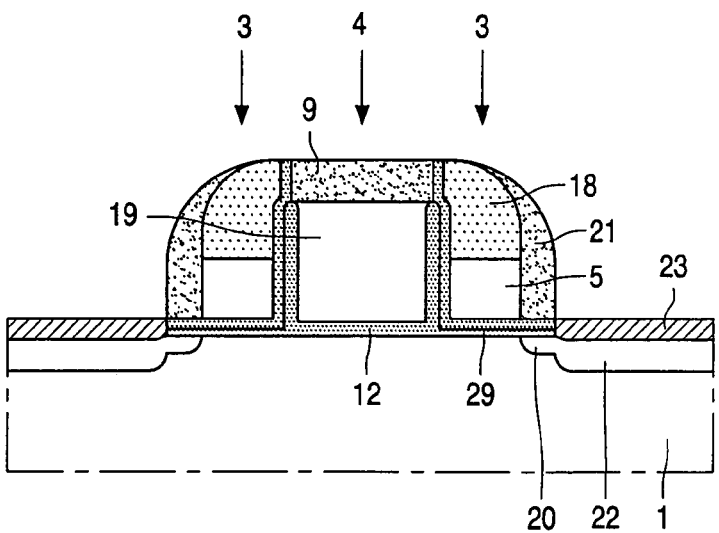

In this example the charge storage region between the control gate 5 and the semiconductor body 1 is formed by a layer 30 consisting of a silicon nitride which is deposited on the gate structure 4 before the conductive layer 13 is deposited and the silicon oxide layer 29. After the control gate 5 has been is formed, as shown in FIG. 20, the lightly doped source- and drain zones are formed, the spacer 21 is formed. Then, as shown in FIG. 21, the layer 30 as well as the layer of silicon oxide 29 formed on the surface 2 of the semiconductor body 1 are etched using the spacer 21 as a mask, the highly doped source- and drain zones 22 and silicide regions are formed. Using the described method this memory cell can be made easily.

Figure 22:
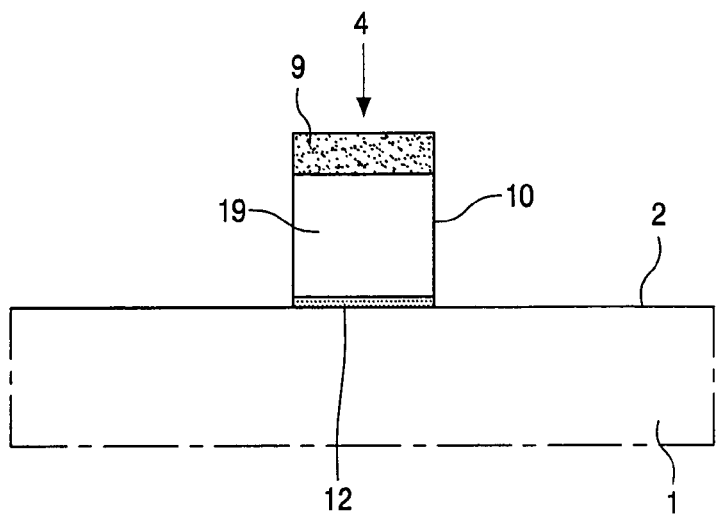
Figure 23:
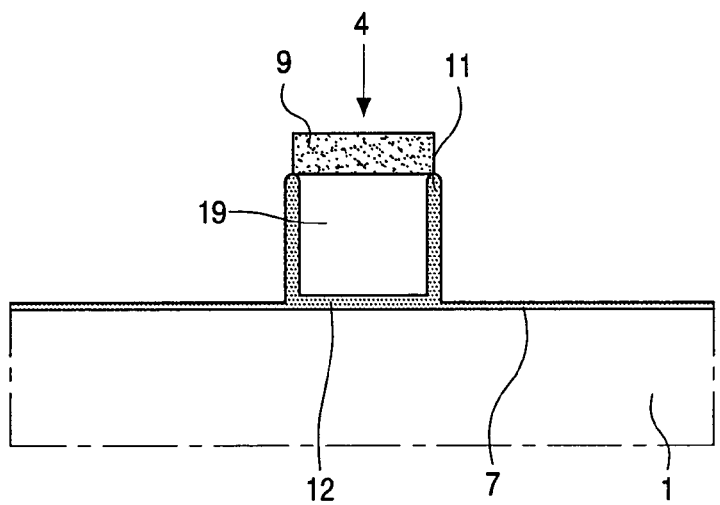

In the next two preferred embodiments of the manufacturing of memory cells, as shown in FIGS. 22 to 23, the gate structure 4 with the access gate 19 on gate oxide 12 is formed, the side walls 10 of this gate structure 4 are covered with an insulating layer 11 and the semiconductor body 1 next to the gate structure 4 with tunnel dielectric layer 7. Then a floating gate on the tunnel dielectric 4 and covered with an inter gate dielectric will be formed next to the gate structure 4, this floating gate having a top surface lower than the gate structure 4 with the access gate 19. Then the conductive layer 13 is deposited, planarized, etched back and patterned using the spacer 18 formed on the exposed portions 25 of the gate structure 4 with the access gate 19 as a mask so as to form the control gate 5 on the inter gate dielectric 8. This method offers the opportunity of realizing a number of simple memory cells.

Figure 24:
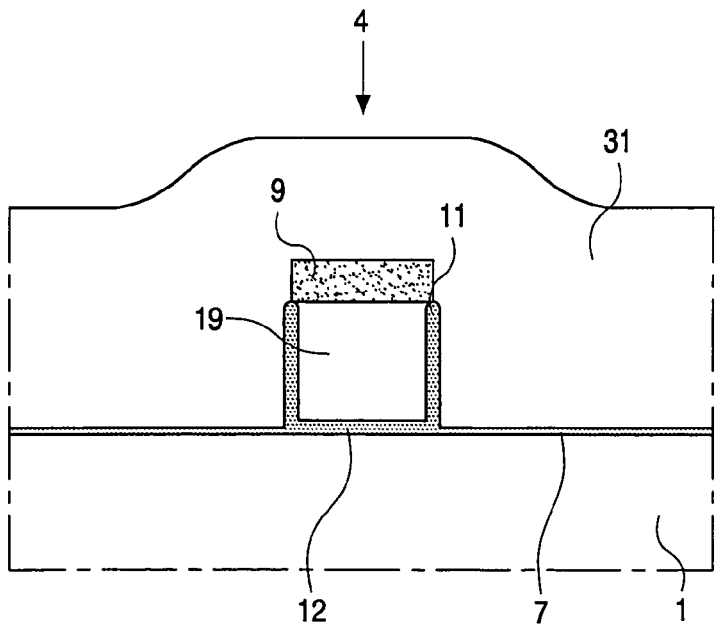

The first example is described with reference to FIGS. 24 to 30. As shown in FIG. 24 the gate structure 4 is covered with a further layer 31 of conductive material, here an about 600 nm thick layer of polycrystalline silicon. As shown in FIG. 13 this further conductive layer 31 is planarized until top layer 9 is exposed. Because the further layer has a thickness larger than that of the gate structure 4 the planarized further conductive layer 32 has a flat surface 34. Then, as shown in FIG. 26 the planarized further conductive layer 33 is etched back until portions 35 of the gate structure 4 are exposed. This etching back can be carried out by means of an isotropic etch or anisotropic etch or as a combination of an isotropic etch and an anisotropic etch. The remaining part 36 of the further conductive layer has a thickness of about 100 nm.

Figure 28:
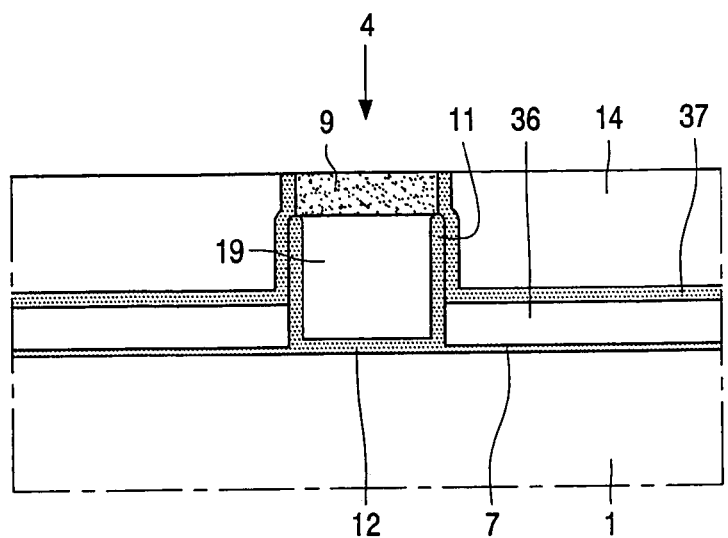
Figure 29:
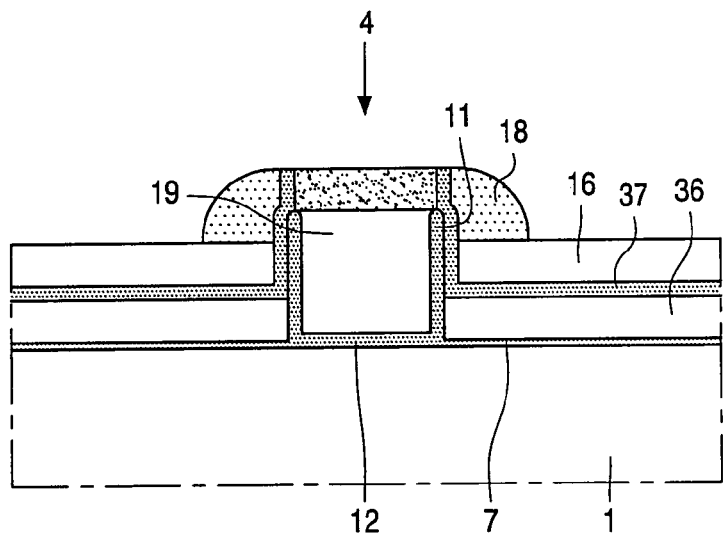

The structure as shown in FIG. 26 the is covered with a layer 37 of an inter gate dielectric her a layer composed made up of a 6 nm thick layer of silicon oxide, a 6 nm thick layer of silicon nitride and a 6 nm thick layer of silicon oxide. Then, as shown in FIG. 28, the conductive layer is deposited, planarized so as to form the planarized conductive layer 14. The planarized layer 14 then is etched back to form the conductive layer 16. The layer 16 then is patterned using the spacer 18 formed on the exposed portions 15 of the gate structure 4 as a mask so as to form the control gate 5 in the etched back conductive layer 16 as well as the floating gate 6 in the further etched back conductive layer 36.

After the control gate 5 has been is formed, the lightly doped source- and drain zones 20 are formed. Then the spacer 21 is formed and, as shown in FIG. 30, the highly doped source- and drain zones 22 and silicide regions 23 are formed.

Figure 30:
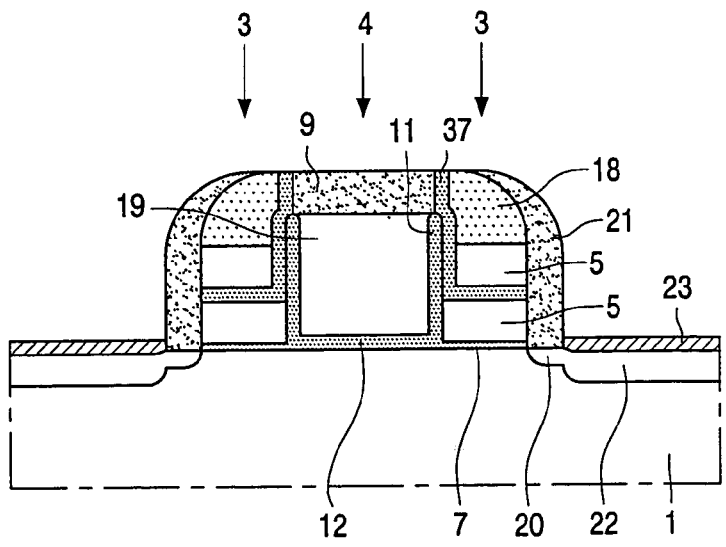

As can be seen in the FIG. 30 the inter gate dielectric 37 is present between the access gate 19 and the control gate 5 so that the electric coupling between these gates is relatively small.

The second example is described with reference to FIGS. 31 to 36. In the memory cell made using this method the electric coupling between the control gate 5 and access gate 19 as also small and further the floating gate 6 is fully surrounded by the control gate 5 so that the electric coupling between the control gate 5 and the floating gate 6 is relatively large.

Figure 25:
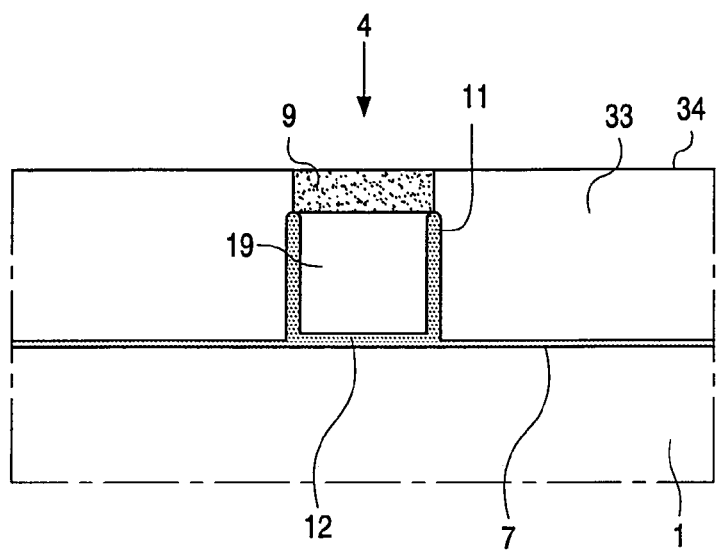
Figure 26:
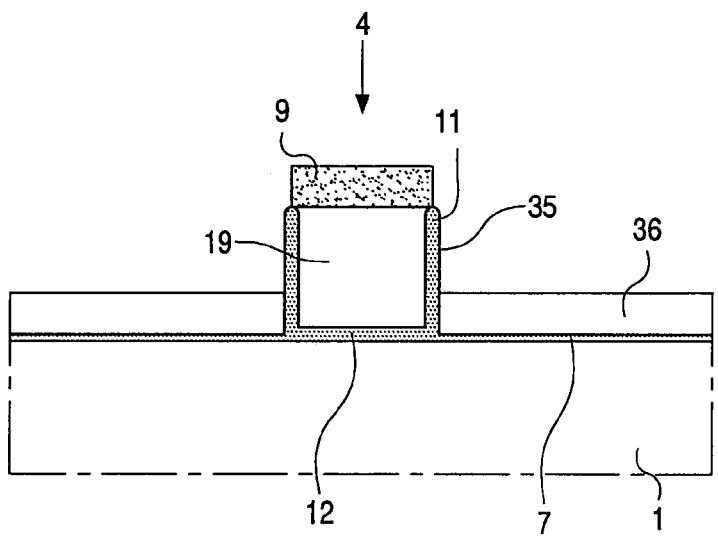
Figure 27:
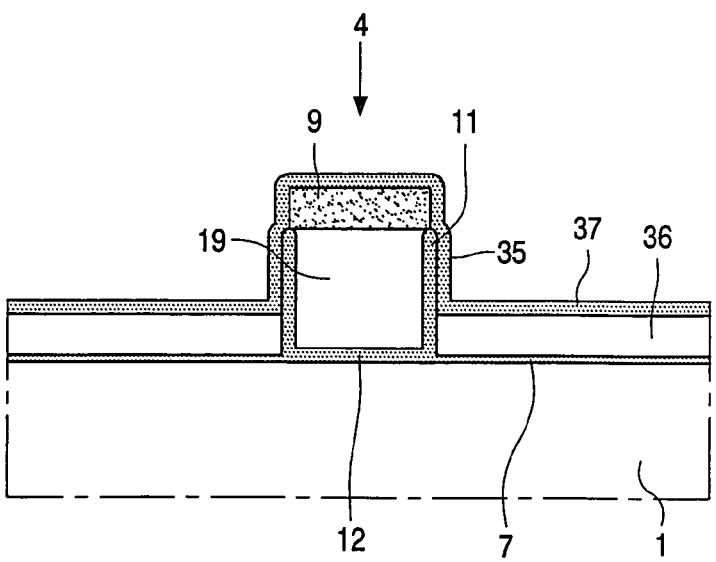
Figure 31:
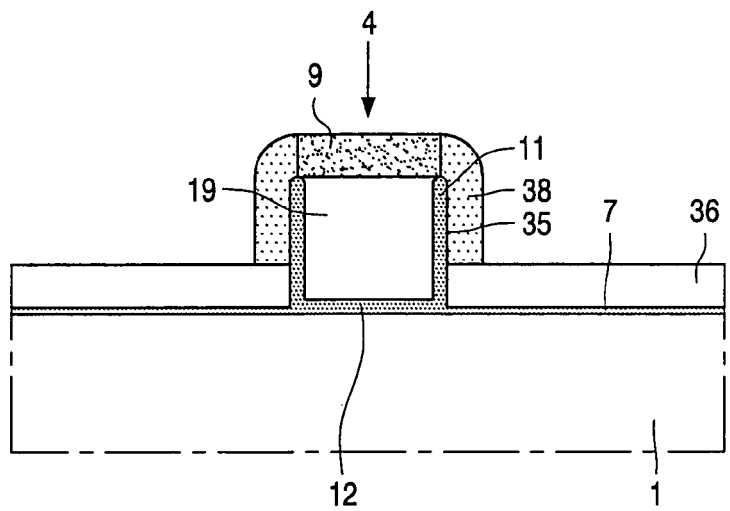
Figure 32:
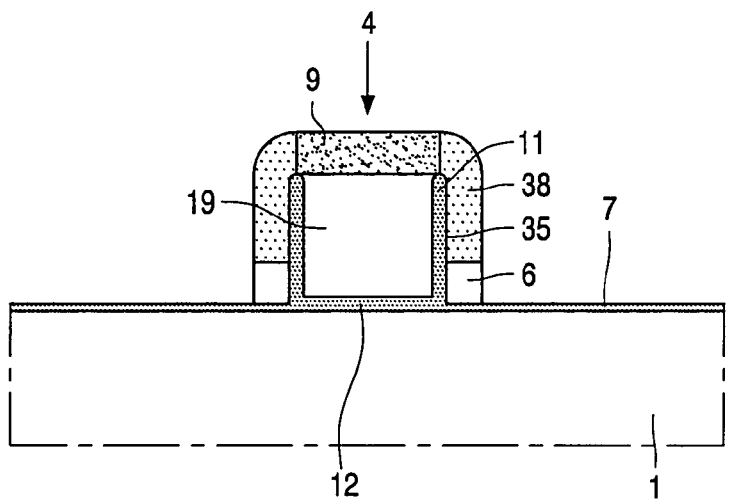
Figure 33:
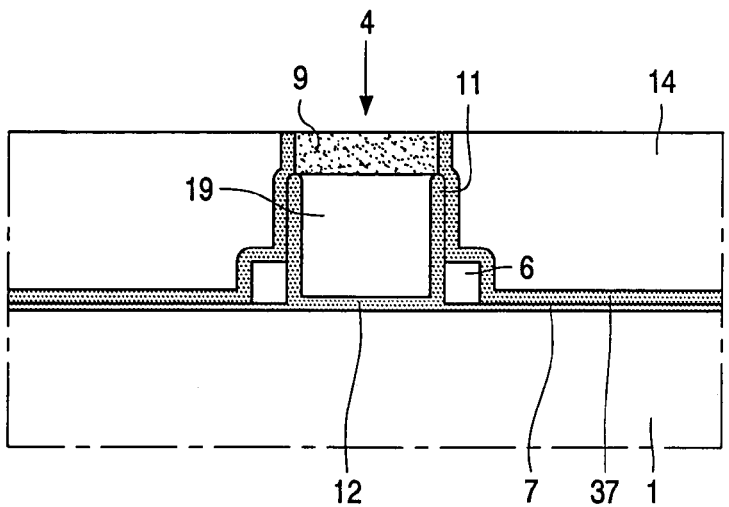
Figure 34:
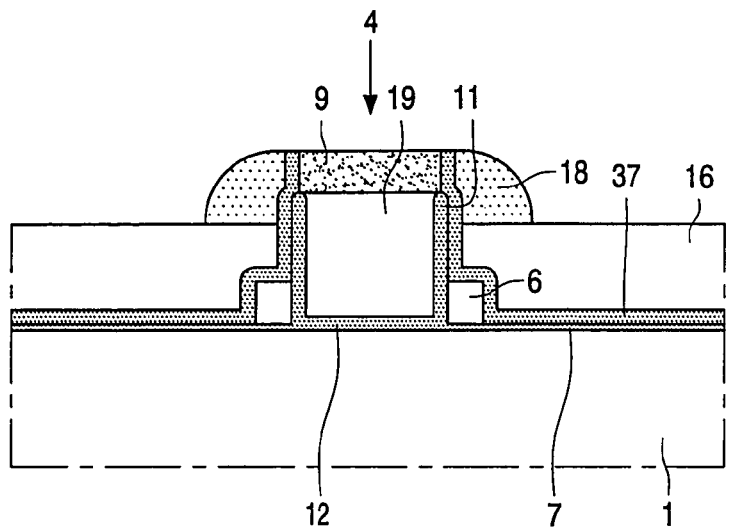
Figure 35:
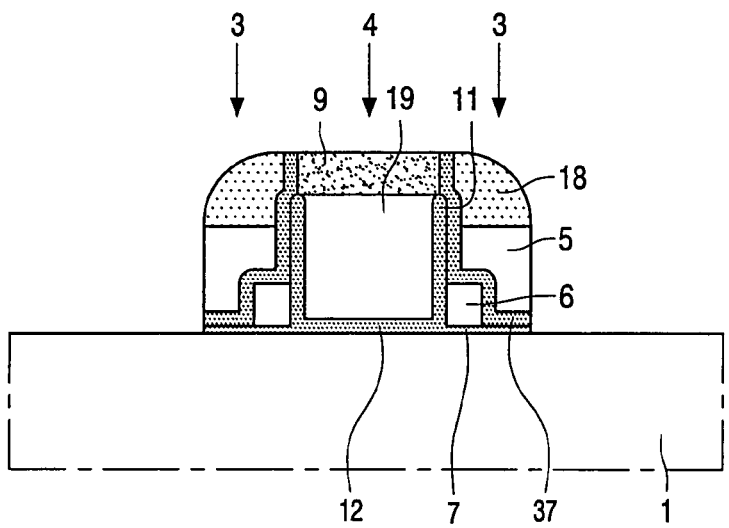
Figure 36:
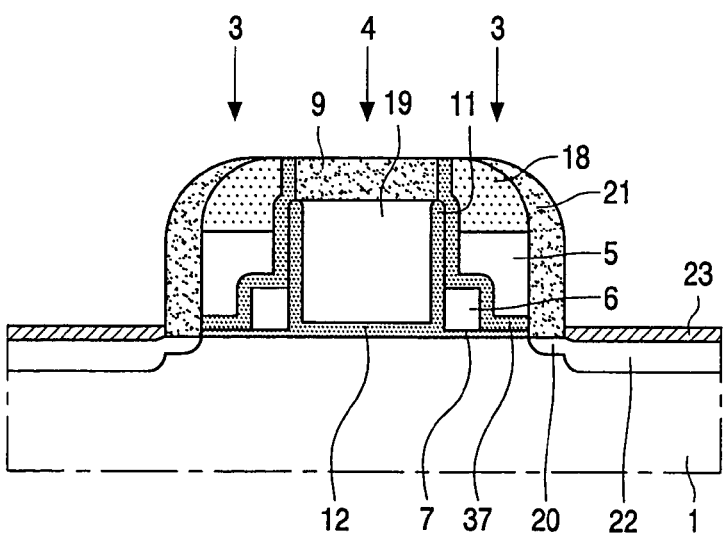

This manufacture of the second example starts with the structure as shown in FIG. 25, where next to the gate structure 4 comprising the access gate 19 the about 100 nm thick further conductive layer 36 had been formed. Then, as shown in FIG. 31, a further spacer 38 is formed and the conductive layer 36 is etched so as to form the floating gate 6 on the tunnel dielectric layer 7 next to the gate structure 4 with the access gate. After removal of the further spacer 38, the so formed floating gate 6 is provided with a layer of an inter gate dielectric 37, the conductive layer is deposited, planarized, whereby the conductive layer 14 is formed. The layer 14 then is etched back to form conductive layer 16. After this the spacer 18 is formed and the conductive layer 14 is patterned using the spacer 14 as a mask so as to form the control gate 5 on the floating gate 6.

After the control gate 5 has been is formed, the lightly doped source- and drain zones 20 are formed. Then the spacer 21 is formed and, as shown in FIG. 30, the highly doped source- and drain zones 22 and silicide regions 23 are formed.

The further spacer 38 has a width smaller than the width of the spacer 18 so that the floating gate 6 is fully surrounded by the control gate 5. The electrical coupling between both gates then is optimal. Such a small spacer could also be made by depositing a conductive layer followed by an anisotropic etch whereby a small conductive spacer would be left next to the gate structure 4. The method described before however is more reliable.

Figure 15:
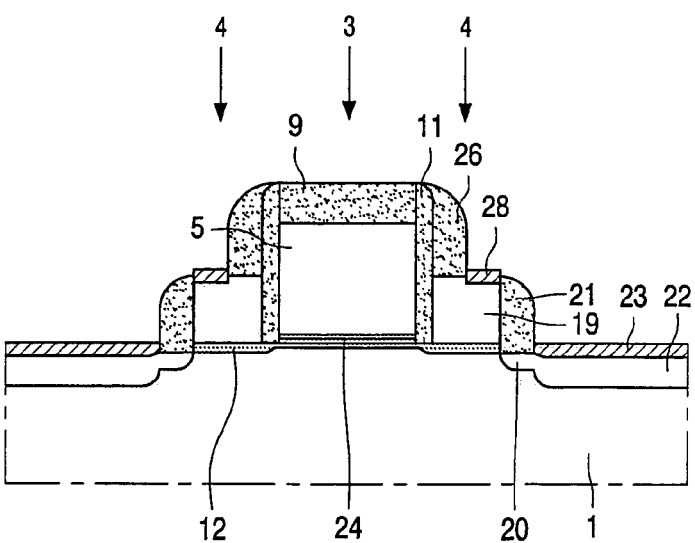
Figure 16:
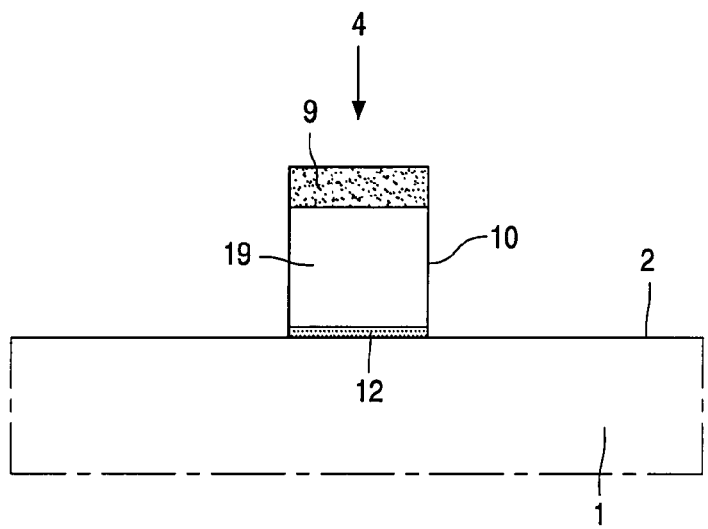

It will be clear that the spacer 18 as shown in FIG. 13 after patterning the conductive layer 14 may be removed from the upper portions of the second one of the gate structures. These upper portions form the access gate 19 in FIGS. 9 and 15 or the control gate 5 in the FIGS. 21, 30 and 36. The gates thus exposed after patterning the conductive layer 16 then can be provided with a silicide top layer as shown in FIG. 15. The same of course is applicable for the top layer 9 formed on the first one of the gate structures.

Figure 12:
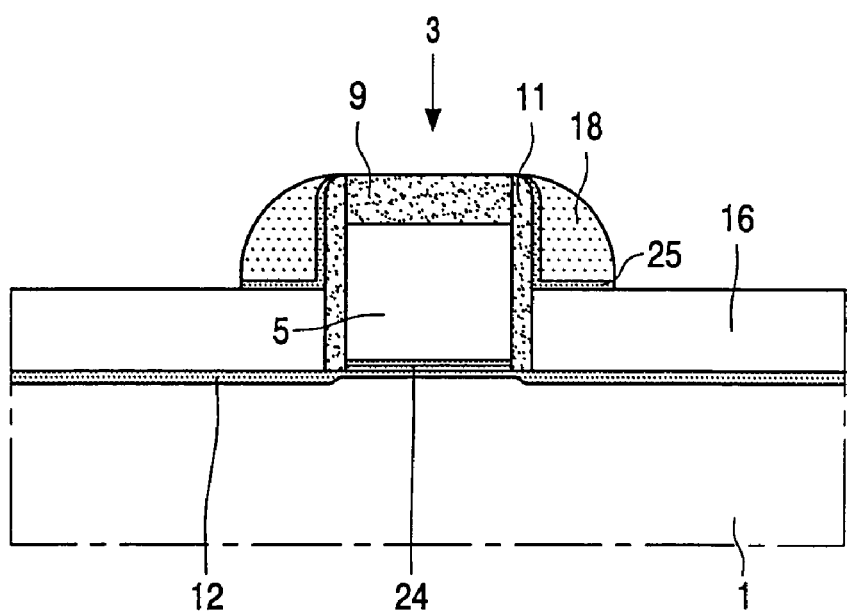

Preferably the spacer 18 then is formed as shown in FIGS. 11 and 12 in a relatively thin first 25 and a relatively thick second layer 17. During an anisotropic etch both layers are etched until the top of the first one of the gate structures is exposed. The first and second layers are chosen in such a way that the second relatively thick layer can be etched selectively with respect to the relatively thin first layer. When the second relatively thick layer 17 is a layer of the same material as the material of the conductive layer 13 the relatively thick part of the spacer 18 is removed in the same etching process in which the conductive layer 14 is patterned. The thin layer part 25 under the spacer 18 then is used as the mask.

What is claimed is:

1. Method of manufacturing a semiconductor device comprising a semiconductor body which is provided at a surface with a non-volatile memory comprising a memory cell with a gate structure with an access gate and a gate structure with a control gate and a charge storage region situated between the control gate and the semiconductor body, in which method on the surface of the semiconductor body a first one of said gate structures is formed with side walls extending substantially perpendicular to the surface, a conductive layer is deposited on and next to said first gate-structure, the conductive layer is subjected to a planarizing treatment until the first gate structure is exposed and the so planarized conductive layer is patterned so as to form at least a part of the other gate structure adjoining the first gate structure, characterized in that, to perform said patterning of the planarized conductive layer, the planarized conductive layer is etched back so as to expose an upper portion of the side walls of the first gate structure, a spacer is formed on the exposed upper portion of the side walls of first gate structure and the conductive layer is etched anisotropically using the spacer as a mask.

2. Method as claimed in claim 1, characterized in that, as the first one of said gate structures the gate structure with the control gate and the charge storage region situated between the control gate and the semiconductor body is formed, after which the side walls of this gate structure are covered by an insulating layer and the surface of the semiconductor body next to the gate structure with a gate dielectric, the conductive layer is deposited, planarized, etched back and patterned using the spacer formed on the exposed portions of the gate structure as a mask so as to form the gate structure with the access gate.

3. Method as claimed in claim 1, characterized in that, as the first one of said gate structures the gate structure with the access gate is formed, after which the side walls of this gate structure are covered by an insulating layer, the conductive layer is deposited, planarized, etched back and patterned using the spacer formed on the exposed portions of the gate structure as a mask so as to form the control gate of the gate structure with the control gate and the charge storage region situated between the control gate and the semiconductror body.

4. Method as claimed in claim 3, characterized in that, after the gate structure with the access gate is formed and the side walls of this gate structure are covered with an insulating layer, a charge storage region is formed next to the gate structure in the form of a collection of mutually separated trapping centers, after which the conductive layer is deposited, planarized, etched back and patterned using the spacer formed on the exposed portions of the gate structure with the access gate as a mask so as to form the control gate on the charge storage region.

5. Method as claimed in claim 3, characterized in that, after the gate structure with the access gate is formed and the side walls of this gate structure are covered with an insulating layer, a floating gate on a tunnel dielectric and covered with an inter gate dielectric is formed next to the gate structure, this floating gate having a top surface lower than the gate structure with the access gate, after which the conductive layer is deposited, planarized, etched back and patterned using the spacer formed on the exposed portions of the gate structure with the access gate as a mask so as to form the control gate on the inter gate dielectric.

6. Method as claimed in claim 5, characterized in that, for forming the floating gate on the tunnel dielectric next to the gate structure with the access gate, a further layer of conductive material is deposited, planarized, etched back to expose upper portions of side walls of the gate structure with the access gate and covered with a layer of an inter gate dielectric, the conductive layer is deposited, planarized, etched back and patterned using the spacer formed on the exposed portions of the gate structure with the access gate as a mask so as to form the control gate in the conductive layer as well as the floating gate in the further conductive layer.

7. Method as claimed in claim 5, characterized in that, for forming the floating gate on the tunnel dielectric next to the gate structure with the access gate, a further layer of conductive material is deposited, planarized, etched back to expose upper portions of side walls of the gate structure with the access gate, after which a further spacer is formed on the exposed upper portions and the further conductive layer is etched using the further spacer as a mask, after which the further spacer is removed and the so formed floating gate is provided with a layer of an inter gate dielectric, the conductive layer is deposited, planarized, etched back and patterned using the spacer formed on the exposed portions of the gate structure with the access gate as a mask so as to form the control gate on the floating gate.

8. Method as claimed, in claim 1 characterized in that, before the deposition of the conductive layer on top of the first one of said gate structures an insulating layer is formed which may act as a stop layer during the planarization of he conductive layer.

9. Method as claimed in claim 1, characterized in that, after patterning the conductive layer the spacer on the upper portions of the second one of the gate structures is removed.

10. Method as claimed in claim 9, characterized in that for forming the spacer a relatively thin first and a relatively thick second layer are deposited, after which an anisotropic etch is performed whereby both layer are etched until the top of the first one of the gate structures is exposed, whereby the first and second layer are chosen, so the second relatively thick layer can be etched selectively with respect to the relatively thin first layer.

11. Method as claimed in claim 10, characterized in that the second relatively thick layer is a layer of the same material as the material of the conductive layer.

* * * * *